(12) United States Patent
Dey et al.

(10) Patent No.: US 8,886,879 B2
(45) Date of Patent: Nov. 11, 2014

(54) TCAM ACTION UPDATES

(75) Inventors: Suddha Sekhar Dey, Roseville, CA (US); Brian E. Krelle, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 167 days.

(21) Appl. No.: 13/458,345

(22) Filed: Apr. 27, 2012

(65) Prior Publication Data
US 2013/0290622 A1    Oct. 31, 2013

(51) Int. Cl.
*G06F 13/00* (2006.01)
*G06F 13/28* (2006.01)
*G06F 17/30* (2006.01)
*G06F 11/10* (2006.01)

(52) U.S. Cl.
CPC ...... *G06F 17/30982* (2013.01); *G06F 11/1064* (2013.01)
USPC .......................................... 711/108; 365/49.1

(58) Field of Classification Search
CPC ....................... G06F 17/30982; G06F 11/1064
USPC ............ 711/108, 128; 365/49.1–50; 370/392, 370/389; 709/240
See application file for complete search history.

(56) References Cited

U.S. PATENT DOCUMENTS

| | | | |
|---|---|---|---|
| 6,807,077 B2 | 10/2004 | Noda et al. | |
| 7,062,571 B1 | 6/2006 | Dale et al. | |
| 7,516,119 B1* | 4/2009 | Kao | 1/1 |
| 8,090,901 B2 | 1/2012 | Lin et al. | |
| 2002/0191605 A1* | 12/2002 | Lunteren et al. | 370/389 |
| 2010/0169563 A1* | 7/2010 | Horner | 711/108 |
| 2010/0293327 A1* | 11/2010 | Lin et al. | 711/108 |
| 2011/0038375 A1 | 2/2011 | Liu et al. | |

OTHER PUBLICATIONS

Ravikumar, V.C., TCAM Architecture for IP lookup using prefix properties, Mar-Apr 2004, Micro IEEE, vol. 24 Issue 2, 60-69.*
Huang, et al., "Dynamic Measurement-Aware Routing in Practice," May-Jun. 2011, vol. 25, Issue 3, pp. 29-34.
McKeown, et al., "OpenFlow: Enabling Innovation in Campus Networks," Mar. 14, 2008, 6 pages.

* cited by examiner

*Primary Examiner* — Sanjiv Shah
*Assistant Examiner* — Shane Woolwine

(57) ABSTRACT

Systems, and methods, including executable instructions and/or logic thereon are provided for ternary content addressable memory (TCAM) updates. A TCAM system includes a TCAM matching array, a TCAM action array that specifies actions that are taken upon a match in the TCAM array, and a TCAM driver that provides a programmable interface to the TCAM matching array and the TCAM action array. Program instructions are executed by the TCAM driver to add a divert object which encompasses actions associated with the TCAM actions array and to apply the divert object to update action fields in the TCAM action array, without changing the relative order of entries in the TCAM matching array, while hardware is simultaneously using the entries.

15 Claims, 3 Drawing Sheets

EXTENDING A TCAM DRIVER TO ADD A DIVERT OBJECT WHICH ENCOMPASSES ACTIONS ASSOCIATED WITH A TCAM ACTION ARRAY — 210

APPLY A DIVERT OBJECT IN THE DRIVER TO OVERWRITE A TCAM ACTION FIELD ASSOCIATED WITH A CLASSIFICATION FIELD IN A TCAM ENTRY WITHOUT DISTURBING CLASSIFICATION FIELDS IN THE TCAM ENTRIES — 220

Fig. 3

| RULE # | SOURCE IP | DEST IP | PROTOCOL | SOURCE PORT | DEST PORT | ACTION (IP NEXTHOP) |
|---|---|---|---|---|---|---|
| 1 | 10.10.10.12 | 20.20.20.12 | IP | * | * | 21.20.20.2 |
| 2 | * | * | TCP | 2000 | 3200 | 15.15.15.1 |
| 3 | 13.12.20.* | * | TCP | * | * | 15.15.15.1 |
| 4 | 26.25.*.* | * | UDP | 65 | 69 | 31.20.20.5 |

Fig. 4

| RULE # | SOURCE IP | DEST IP | PROTOCOL | SOURCE PORT | DEST PORT | ACTION (IP NEXTHOP) |
|---|---|---|---|---|---|---|
| 1 | 10.10.10.12 | 20.20.20.12 | IP | * | * | 21.20.20.2 |
| 2 | * | * | TCP | 2000 | 3200 | 25.25.25.2 |
| 3 | 13.12.20.* | * | TCP | * | * | 25.25.25.2 |
| 4 | 26.25.*.* | * | UDP | 65 | 69 | 31.20.20.5 |

TCAM ACTION UPDATES

BACKGROUND

The rapid growth of networking systems has triggered strong demands for high density and high speed content addressable memory (CAM) devices. For networking applications, ternary content addressable memory (TCAM) is used to store various items such as quality of service (QoS) information, filter information, access control lists (ACL), etc.

As applications such as voice, video, and data appear on converged networks, the need for more control over network traffic has become a signification issue. In particular organizations managing large networks have to ensure efficient traffic-handling throughout the network.

In present TCAM drivers, when a TCAM action of an entry is updated, the entire entry including the classification fields are removed and the new entries are written. Adding a new TCAM entry involves ensuring that the position of the rule in the TCAM is correct in relation to other entries. Very often other TCAM entries have to move to a different location in the TCAM to make room for the new entry. This is a very disruptive process because all traffic has to stop while the TCAM entries are being removed and the new ones added.

BRIEF DESCRIPTION OF THE DRAWINGS

FIG. 3 illustrates a table for a list of entries including classification fields in packet headers, and action fields associated with actions for the entries, that are executed when there is a match in the matching array, before calling a divert object according to embodiments of the present disclosure.

FIG. 4 illustrates a table for a list of entries including classification fields in packet headers, and for action fields associated with action for the entries, which are executed when there is a match in the matching array after a divert object update of action fields has been performed according to embodiments of the present disclosure.

DETAILED DESCRIPTION

Figure 1:
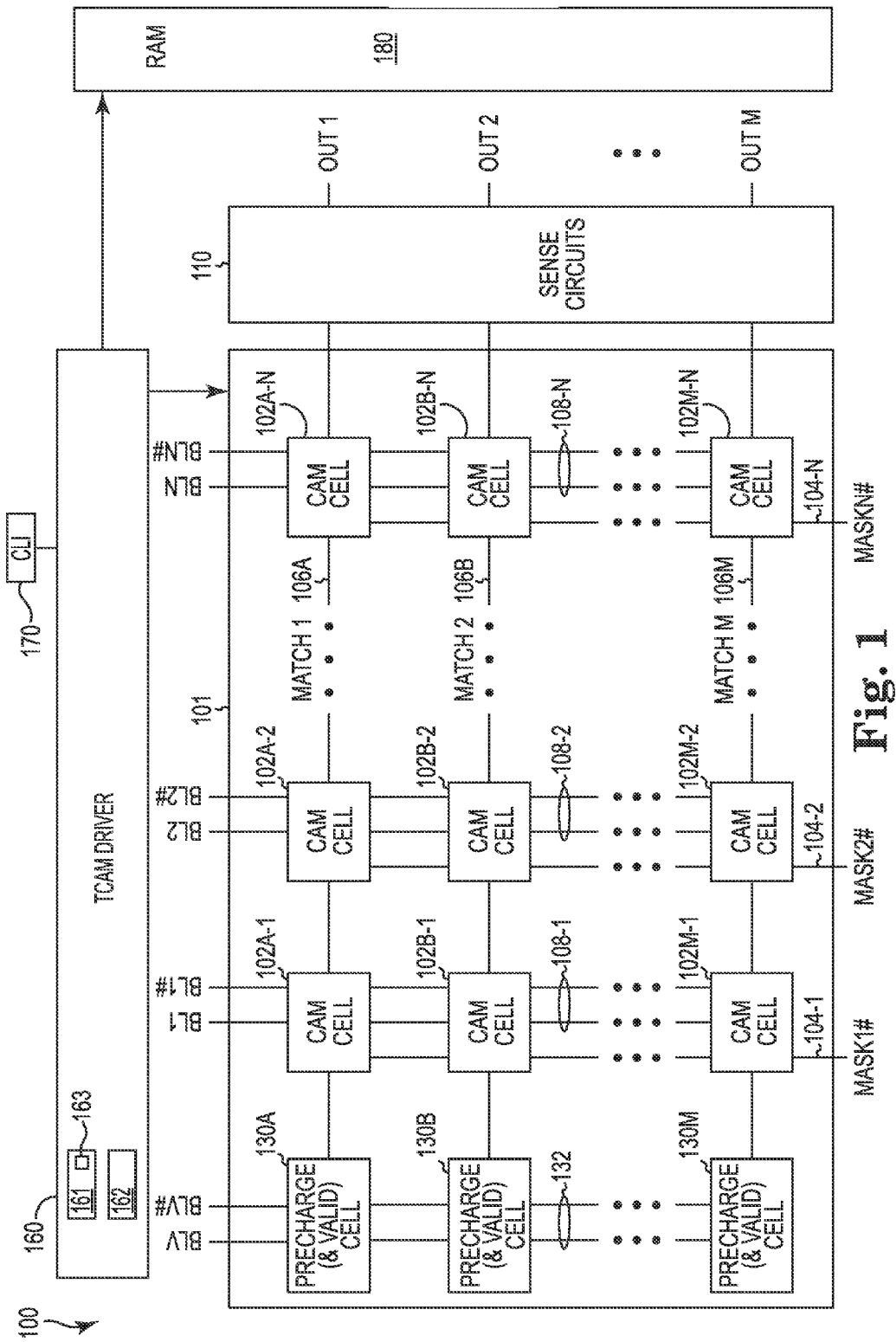
FIG. 1 illustrates a portion of a classification system including a classification matching array, a classification action array and a driver providing a programmable interface to both arrays.

Embodiments of the present disclosure may include systems, and methods, including executable instructions and/or logic thereon to provide ternary content addressable memory (TCAM) action updates. A TCAM system includes a TCAM matching array, a TCAM action array that specifies actions that are taken upon a match in the TCAM matching array, and a TCAM driver that provides a programmable interface to the TCAM matching array and the TCAM action array. Program instructions are executed by the TCAM driver to add a divert object which encompasses actions associated with the TCAM actions array and to apply the divert object to update action fields in the TCAM action array, without changing the relative order of entries in the TCAM matching array, while hardware is simultaneously using the entries.

Embodiments of the present disclosure include TCAM updates to implement various customer visible features, e.g. associated with PBR, PBS, and OpenFlow, that affect the path chosen by a packet based on many fields in the packet header beyond the destination address. That is, to better manage traffic on a network, it may be helpful to have different types of traffic travel over different paths, even when the traffic is traveling to the same destination.

For example, Policy Based Routing (PBR) allows network administrators the ability to use a packet's attributes to manipulate its path. In Policy Based Switching (PBS), depending on certain packet header attributes, packets can be redirected to another port without modifying the packet. This is potentially bridging or hopping between VLANs.

As another example, a goal of encapsulation tunneling of packets is to transport packets of one type through a common network of another type. At the tunnel start, packets are prepended with another network header before transmission. At the tunnel end, the other network header is stripped off before transmitting the original packet.

Open Flow is an open standard that allows experimental protocols to run in production networks. It is being implemented by major switch vendors, and used today by universities to deploy innovative networking technology in their campus networks.

Networking switches use the ability of TCAM systems to classify packets and take actions on classified traffic as the mechanism to implement all of the above features. Each packet is compared with a list of predefined entries, which are the classification fields in the packets header, and finds the highest priority rule that the packet matches. When there is a packet match, those actions associated with the entries are returned by the TCAM and executed.

While TCAM systems are discussed and described herein. Embodiments are not limited to the examples given. As described herein, a TCAM system can more broadly be considered as a classification system including a classification matching array, a classification action array and a classifier software (e.g., computer executable instruction or program instructions) driver providing a programmable interface to the classification matching array and the classification action array to perform actions according to example embodiments given herein.

As used herein, a feature is considered a customer visible solution. Functions provide delineation of implementation to a feature. That is, a driver may be considered a software function. An application specific integrated circuit (ASIC) block, e.g., a TCAM block (array), may be considered as an ASIC function. Actions may be considered as sub-elements of implementation of a particular functionality, e.g., for implementation of a TCAM array functionality.

Various embodiments described herein can be performed by actions, software, application modules, application specific integrated circuit (ASIC) logic and/or executable instructions operable on the systems and devices shown herein or otherwise. "Software" and "program instructions", as used herein, include computer executable instructions that can be stored in a non-transitory computer-readable medium (memory) and executed by the hardware logic of a processor (e.g., transistor gates) to perform a particular task. Memory, as the reader will appreciate, can include random access memory (RAM), read only memory (ROM), non-volatile memory (such as Flash memory), etc.

The embodiments of the present disclosure may be implemented in a stand-alone computing system or a distributed computing system. As such, FIGS. 1-4 are intended to provide a context for the description of the acts, functions and operations of the present disclosure. Program instructions and/or logic, suitable for carrying out embodiments of the present invention, can be resident in one or more devices or locations or in several devices and/or locations in a network.

FIG. 1 is a block diagram of a ternary content addressable memory (TCAM) system 100. TCAM system includes a TCAM matching array, an action array and a driver providing a programmable interface to both the matching array and the actions array. As shown in FIG. 1, the matching array, comprised of TCAM cells 101 and sense circuits 110 and/or other match logic (e.g., hardware), may include a two-dimensional array of TCAM cells, e.g., 102A-1, 102A-2, . . . , 102M-N, physically or logically arranged into M rows by N columns. Each row of the TCAM array includes N cells that collectively store data for an entry in the array. An entry, as used herein, is therefore synonymous with a row of the TCAM. An entry may be defined to include one or more words of data, i.e., data words, per entry. A word is simply a grouping of bit(s), typically functioning together to encode a piece of information. According to embodiments of the present invention, words are searchable portions of entries, for example, formed by physical or logical columns of cells within a TCAM array.

FIG. 1 illustrates the TCAM cells 101 coupled to sense circuits 110 to form the matching array and having output signal lines designated as OUT 1, OUT 2, . . . , OUT M to an action array 180, e.g., random access memory (RAM). The action array 180 can includes actions, e.g., instructions that are executed to implement actions, when a match occurs in the matching array. However, TCAM cells 101 could be directly connected to a memory array, e.g., action array, with each row of the memory array storing data corresponding to each entry, i.e., row, of the TCAM cells 101. TCAM cells, e.g., cell array 101, could similarly be connected to some other type of memory element, or a match line encoder, e.g., a priority encoder, for giving an indication of whether a match occurred or not, determining the highest priority match, and indicating the address of the best match.

The TCAM entries along the same column can share the same set of bit line pairs, e.g., BL1-BL1#, BL2-BL2#, . . . BLN-BLN#, so that data comparisons can be executed on all the entries simultaneously. Each column of the TCAM array is also associated with a mask control, e.g., MASK1#, MASK2#, . . . , MASKN#, that couples to all TCAM cells in the column. Each of the N columns of the TCAM array is associated with a specific bit position of an N-bit input search data pattern, e.g., representing an address, port, etc. A differential data line pair, 108-1, 108-2, . . . , 108-N, e.g., BL1-BL1#, BL2-BL2#, BLN-BLN#, is provided for each compare data bit and couples to all cells in the corresponding column of the TCAM array. The differential data lines, 108-1, 108-2, . . . , 108-N, can also be used to write data into a given cell in the TCAM array.

According to embodiments of the present invention, mask lines, e.g., 104-1, 104-2, . . . , 104-N, enable or disable a column's participation in a compare and/or write operation, for example, where the input search data pattern is a subset of the N-bit width of a entry, or the relevant portion of the input search data pattern is a subset of the entire input search data pattern. By masking certain columns of the array, to participate in or not participate in, a compare and/or write operation, the contents of the cells in the certain columns of the TCAM array can be left undisturbed in a write update operation. In this manner, a write update can be made to a portion of the columns comprising each entry, i.e., a columnar portion of each entry.

A TCAM driver 160 provides a programmable interface to both the matching array 101 and 110 and the actions array 180 in which embodiments of the present disclosure can be implemented. According to embodiments, program instructions can be stored in a memory 161 and executed by a processing resource 162 of the TCAM driver 160 to perform the actions and functionality described herein. As shown in FIG. 1, the classification fields and action fields in the TCAM matching array entries and actions of the action array 180 may be entered by a network administrator through a Command Line Interface (CLI) 170.

In previous TCAM drivers, when a TCAM action of an entry is updated, the entire entry including the classification fields are removed and the new entries are written. Adding a new TCAM entry involved ensuring that the position of the rule in the TCAM is correct in relation to other entries. Very often other TCAM entries have to move to a different spot in the TCAM to make room for the new entry. This is a very disruptive process because all traffic has to stop while the TCAM entries are being removed and the new ones added.

In contrast, embodiments of the present invention extend the TCAM driver 160 to add a divert object which encompasses actions including: forcing packets in and/or out of a given port or link aggregation group; overriding an IP Next Hop gateway, either unconditionally or only on default gateways; changing a VLAN Membership of a packet; dropping a packet, and/or copying a packet to a switch processor and then dropping the packet. Embodiments, however, are not limited to these examples and additional action may be included.

As used herein, a divert object is a data structure represents one or more actions associated with action fields associated in the TCAM entries. That is, the divert object represents action fields which may be stored in the TCAM matching array 101 and 110 and associated actions in the action array 180. The TCAM driver 160 can execute instructions to retrieve actions from the actions array 180 when there is a match in the matching array 101 and 110 and execute the same. Program instructions can be stored in the memory 161 of the TCAM driver 160 and executed by the processing resource 162 to update actions returned by the action array 180 without changing the relative order of entries in the TCAM matching array 101.

The TCAM driver 160 provides a programming interface to add, update, and delete divert objects. Further, the program instructions can be executed to update action fields in the TCAM entries while hardware is simultaneously using the entries. In at least one embodiment, the program instructions described herein, associated with the TCAM driver 160, can be retrieved from a remote memory, e.g., memory located elsewhere in a distributed computing network and/or cloud computing environment.

In one or more embodiments, the program instructions can be executed by the TCAM driver 160 to interface to different ASIC families in a single system, e.g., mixed family chassis. Further, the program instructions are executed to respond to and/or accommodate different actions of for multiple ASIC families, when a particular ASIC generation does not have a particular functionality associated with a later ASIC generation, e.g., an action associated with a particular action array. Additionally, the program instructions can be executed to hide implementation differences for equivalent functionality between the different ASIC families. Embodiments allow the program instructions are executed such that the divert object can be associated with multiple TCAM entries. A single call to the TCAM driver to update the divert object will update all the TCAM entries that are associated with the divert object.

Figure 2:
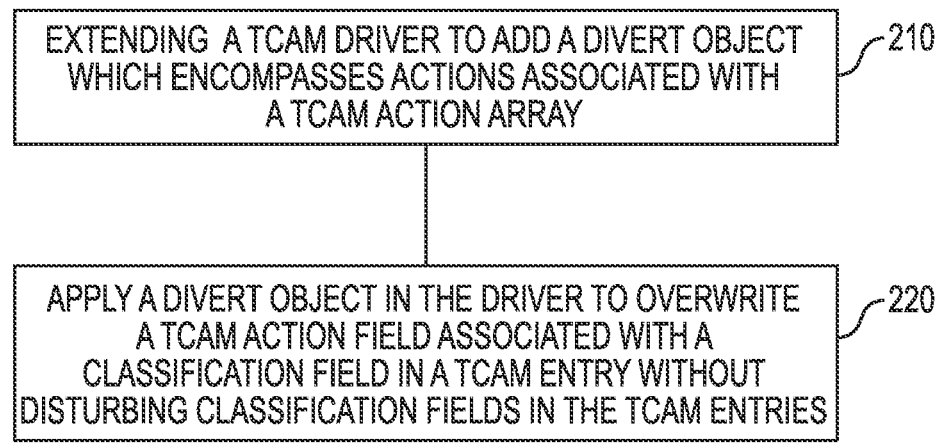
FIG. 2 illustrates a flow diagram for a method embodiment according to the present disclosure.

FIG. 2 illustrates a flow diagram of a method embodiment for updating a TCAM according to the present disclosure. As shown at block 210 in FIG. 2, the method includes extending a TCAM driver to add a divert object which encompasses actions including forcing packets in and/or out of a given port or link aggregation group; overriding an IP Next Hop gateway, either unconditionally or only on default gateways;

changing a VLAN Membership of a packet; copying a packet to a switch processor and then dropping the packet.

At block 220, program instructions are executed to cause the TCAM to apply the divert object to overwrite a TCAM action field associated with one or more TCAM entries and/or associated with one or more TCAM entries. This action is performed without disturbing classification fields associated with entries in the TCAM. Further, the program instructions are executed to update actions returned by the TCAM, without changing the relative order of entries in the TCAM, while hardware is simultaneously using the entries.

As noted above, the program instructions can be executed to add limitations to accommodate different ASIC families, including ASICs which do not have functionality associated with one or more features associated with a later ASIC generation. In this manner, program instructions can be executed to override an IP Next Hop gateway decision for IP forwarded packets according to at least two options. For example, the divert object could provide at least two options, both of which are used by PBR. This first option would include an option to unconditionally override IP Next Hop gateway decision. A second option would include an option to conditionally override the normal IP Next Hop gateway decision with a specified gateway only when the normal IP Next Hop is a default route.

As another example, the program instructions can be executed to use the divert object to perform at least one action including forcing packets in and/or out of a given port or link aggregation group; overriding an IP Next Hop gateway, either unconditionally or only on default gateways; changing a VLAN Membership of a packet; copying a packet to a switch processor and then dropping the packet, and/or to deny packets.

According to embodiments, the program instructions can be executed to use the divert object to force packets to be encapsulated and/or de-capsulated as used for tunneling of packets to transport packets of one type through a common network of another type, e.g., at a tunnel start, packets are pre-pended with another network header before transmission and at the tunnel end, the network header is stripped off before transmitting the original packet. In another example, the program instructions can be executed to use the divert object to update an action field to perform at least one action including forcing packets in and/or out of a given port or link aggregation group; copying a packet to a switch processor and then dropping the packet, denying packets and/or taking no action.

FIG. 3 illustrates a table for a list of entries, e.g., classification fields in packet headers, and for action fields, e.g., IP NextHop associated with the entries, that are returned by the TCAM and executed when there is a packet match, before calling a divert object according to embodiments of the present disclosure. That is, each packet is compared with a list of predefined entries, which are the classification fields in the packets header, and finds the highest priority rule that the packet matches. When there is a packet match, those actions associated with the entries are returned by the TCAM and executed.

As shown in FIG. 3, the table for the list of entries includes four (4) entries, e.g. 301, 302, 303 and 304. Four rules are shown, by way of example and not by way of limitation, for ease of illustration. Many more rules may be provided according to embodiments of the present disclosure.

FIG. 3 illustrates that a first Rule #1 (310) is associated with a source IP address 311 (10.10.10.12), a destination address 312 (20.20.20.12), a protocol address 313 (e.g., IP protocol), a source port number 314 (* indicates a don't care field in the TCAM), a destination port number 315 (*), and an action field address 316 (21.20.20.2). In the example of FIG. 3, a second Rule #2 (320) is associated with a source IP address 321 (don't care), a destination address 322 (don't care), a protocol address 323 (e.g., Transmission Control Protocol (TCP)), a source port number 324 (2000), a destination port number 325 (3200), and an action field address 326 (15.15.15.1). A third Rule #3 (330) is associated with a source IP address 331 (13.12.20.*), a destination address 332 (don't care), a protocol address 333 (e.g., TCP protocol), a source port number 334 (don't care), a destination number 335 (don't care), and an action field address 336 (15.15.15.1). A fourth Rule #4 (340) is associated with a source IP address 341 (26.25.*.*), a destination address 342 (don't care), a protocol address 343 (e.g., User Datagram Protocol (UDP)), a source port number 344 (65), a destination port number 345 (69), and an action field address 346 (31.20.20.5).

FIG. 4 illustrates a table for a list of entries, e.g., classification fields in packet headers, and for action fields, e.g., IP NextHop associated with the entries, which are returned by the TCAM and executed when there is a packet match after a divert object update of action fields according to embodiments of the present disclosure. FIG. 4 illustrates that program instructions can be executed to update the action field 426 associated with Rule#2 and action field 436 associated with Rule#3 without disturbing classification fields associated with entries in the TCAM. For example, if a configured action (e.g. NextHop or interface) becomes unreachable (e.g. a computer goes down), the program instructions execute such that the next configured action (e.g., NextHop 25.25.25.2) is written into the TCAM array without disturbing the classification fields of the TCAM entries or the relative order of the TCAM entries.

FIG. 4 illustrates that, upon an indication of a given IP NextHop becoming unreachable (down), e.g. Action (IP NextHop 15.15.15.1), the program instructions will execute to call a divert object with a new "IP NextHop" (e.g., 25.25.25.2) action and cause the action field in the TCAM to be overwritten, keeping the classification fields intact. That is, as shown in FIG. 4, the program instructions execute such that the action field addresses 326 and 336 (e.g. 15.15.15.1 in FIG. 3) will be overwritten with action field addresses and 426 and 436 (e.g., 25.25.25.2 in FIG. 4) without changing the classification fields in a TCAM entry. Further, the program instructions can execute to perform the same without changing the relative order of entries in the TCAM and the program instructions can be executed to update the action fields 426 and 436 in the TCAM entries while hardware is simultaneously using the entries.

Thus, as shown in FIG. 4, the classification fields according to the first Rule #1 (410) is associated with a source IP address 411 (10.10.10.12), a destination address 412 (20.20.20.12), a protocol address 413 (e.g., IP protocol), a source port number 414 (*), a destination port number 415 (*), and an action field address 416 (21.20.20.2) remain the same. In the example of FIG. 4, a second Rule #2 (420) continues to be associated with a source IP address 421 (*), a destination address 422 (*), a protocol address 423 (e.g., TCP), a source port number 424 (2000), a destination port number 425 (3200), and a new action (IP NextHop address 25.25.25.2). A third Rule #3 (430) continues to be associated with a source IP address 431 (13.12.20.*), a destination address 432 (*), a protocol address 433 (TCP), a source port number 434 (*), a destination port number 435 (*), and a new action (IP NextHop address 25.25.25.2). A fourth Rule #4 (440) continues to be associated with a source IP address 441 (26.25.*.*), a destination address 442 (*), a protocol address 443 (UDP), a source port number 444 (65), a destination port number 445 (69), and an action field address 446 (31.20.20.5).

As such, embodiments of the present disclosure may reduce thrashing (e.g. shuffling which when performed stops packet traffic) in the TCAM by only updating the action fields (e.g., action fields associated with particular classification fields according to a particular network setup and/or in response to a device outage) and leaving the classification fields unchanged, by using the added divert object in the TCAM driver. This is due to the fact that when actions fields are changed the classification fields remain unchanged. An additional advantage is that no change to the TCAM driver is required, rather just an extension. That is, embodiments are implemented as a program instruction, e.g., software and/or computer executable instruction, extension to existing TCAM drivers in the field. Hence, legacy TCAM drivers do not have to be replaced to implement the embodiments of the present disclosure.

Although specific examples have been illustrated and described herein, those of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

What is claimed:

1. A ternary content addressable memory (TCAM) system, comprising:
    a TCAM matching array;
    a TCAM action array that specifies actions that are taken upon a match in the TCAM array, the TCAM action array including entries having source IP, destination IP, protocol, source port, destination port, and action fields; and
    a TCAM driver that provides a programmable interface to the TCAM matching array and the TCAM action array, wherein program instructions programmed to the TCAM driver are stored in a memory and executed by a processing resource of the TCAM driver to:
        add a divert object which encompasses actions associated with TCAM action array entries, wherein the divert object is a data structure referencing a particular TCAM action field to change within multiple TCAM action array entries; and
        apply the divert object to change TCAM action fields associated with multiple TCAM action array entries, wherein changing TCAM action fields changes all TCAM action array entries associated with the divert object together without reordering the entries in the TCAM matching array, and without changing any other field in a given TCAM entry, while hardware is simultaneously using the entries.

2. The TCAM system of claim 1, wherein the TCAM driver is configured to override the TCAM conditionally and unconditionally.

3. The TCAM system of claim 2, wherein the TCAM driver is configured to override the TCAM via at least two options including:
    an option to conditionally override an action field; and
    an option to unconditionally override an action field with a specified gateway when programmed as a default route.

4. The TCAM system of claim 3, wherein the program instructions are executed to respond to and accommodate a particular option based on particular functionality for multiple ASIC families, including when a particular ASIC generation does not have a particular functionality associated with a later ASIC generation.

5. The TCAM system of claim 3, wherein the program instructions are executed to hide implementation differences for equivalent functionality between the different ASIC families.

6. The TCAM system of claim 1, wherein the program instructions are executed such that the divert object can be associated with multiple TCAM entries without reordering or disturbing entries.

7. The TCAM system of claim 6, wherein the program instructions are executed such that a single call to the TCAM driver to change the divert object will change all TCAM entries that are associated with the divert object.

8. A method for changing a ternary content addressable memory (TCAM) system including a TCAM matching array, a TCAM action array and a TCAM driver, comprising:
    extending the TCAM driver to add a divert object which encompasses actions associated with the TCAM action array, the TCAM action array including entries having source IP, destination IP, protocol, source port, destination port, and action fields; and
    using the TCAM driver to execute program instructions, stored in a memory, to:
        apply a divert object in the TCAM driver to change TCAM action fields associated with multiple TCAM action array entries, wherein the divert object is a data structure referencing a particular TCAM action field to change within multiple TCAM action array entries, and wherein changing TCAM action fields changes all TCAM action array entries associated with the divert object together, without changing any other field in a given TCAM entry; and
        change actions returned by the TCAM, wherein the program instructions are executed to override an action decision for IP forwarded packets according to at least two options, the at least two options including:
            an option to unconditionally override the action decision; and
            an option to conditionally override the action decision when the action decision is a default decision.

9. The method of claim 8, wherein the program instructions are executed by the TCAM driver to change all action array entries returned by the TCAM.

10. The method of claim 8, wherein the program instructions are executed by the TCAM driver to accommodate different ASIC families, including ASICs which do not have an action associated with the action array.

11. The method of claim 8, wherein the program instructions are executed to:
    override an IP Next Hop gateway decision for IP forwarded packets according to at least two options, the at least two options including:
        an option to unconditionally override IP Next Hop gateway decision; and an option to conditionally override the normal IP Next Hop gateway decision with a specified gateway only when the normal IP Next Hop is a default route.

12. A non-transitory computer-readable medium storing a set of instructions executable by a processor, wherein the set of instructions are executed by the processor to:
- extend a TCAM driver to include a divert object, wherein the divert object implements action fields that are associated with multiple TCAM entries;
- change actions returned by the TCAM, without reordering the entries in the TCAM matching array, the TCAM action array including entries having source IP, destination IP, protocol, source port, destination port, and action fields, while hardware is simultaneously using the entries; and
- apply a divert object to assign a single action to multiple TCAM action field entries in a 1 for N (1:N) manner, where N is a variable number of TCAM entries, wherein the divert object is a data structure referencing a particular TCAM action field to change all TCAM action field entries in multiple TCAM action array entries that are associated with the divert object together, without changing any other field in a given TCAM entry.

13. The medium of claim 12, wherein the instructions are executed to use the divert object to cause a TCAM driver to change an action field with at least one action associated with the action array to:
- force packets into a port or link aggregation group;
- force packets out of a port or link aggregation group; and
- deny packets.

14. The medium of claim 12, wherein the instructions are executed to use the divert object to cause a TCAM driver to:
- change an action field with an action to force packets to be encapsulated into tunnels depending upon ASIC functionality; or
- change an action field with an action to force packets to be de-capsulated depending upon ASIC functionality.

15. The medium of claim 12, wherein the instructions are executed to use the divert object to cause a TCAM driver to change an action field with at least one action, the at least one action includes an action instruction to:
- take no action on a particular group of packets associated with PBR and OpenFlow; and
- copy a particular group of packets to a processor and then drop the packets associated with PBR and OpenFlow.

* * * * *